(12) United States Patent
Honda et al.

(10) Patent No.: US 8,057,603 B2
(45) Date of Patent: Nov. 15, 2011

(54) METHOD OF CLEANING SUBSTRATE PROCESSING CHAMBER, STORAGE MEDIUM, AND SUBSTRATE PROCESSING CHAMBER

(75) Inventors: Masanobu Honda, Nirasaki (JP); Yutaka Matsui, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 946 days.

(21) Appl. No.: 11/671,223

(22) Filed: Feb. 5, 2007

(65) Prior Publication Data
US 2007/0186952 A1 Aug. 16, 2007

Related U.S. Application Data

(60) Provisional application No. 60/778,071, filed on Mar. 2, 2006.

(30) Foreign Application Priority Data

Feb. 13, 2006 (JP) .................. 2006-035548

(51) Int. Cl.
B08B 7/00 (2006.01)
B08B 7/04 (2006.01)

(52) U.S. Cl. ............. 134/1.1; 134/1; 134/26; 134/22.18; 438/905

(58) Field of Classification Search ................. 134/1, 1.1, 134/1.2, 22.18, 26, 30; 438/905
See application file for complete search history.

(56) References Cited

U.S. PATENT DOCUMENTS

| | | | |
|---|---|---|---|
| 5,468,686 A | | 11/1995 | Kawamoto |
| 5,843,239 A | * | 12/1998 | Shrotriya ................. 134/1.1 |
| 6,569,257 B1 | * | 5/2003 | Nguyen et al. ............. 134/26 |
| 6,767,836 B2 | * | 7/2004 | San et al. ................. 438/710 |
| 6,852,242 B2 | * | 2/2005 | Sun et al. ................. 216/60 |
| 6,872,323 B1 | * | 3/2005 | Entley et al. .............. 216/67 |
| 2003/0000546 A1 | * | 1/2003 | Richardson et al. ........ 134/1.1 |
| 2004/0025903 A1 | * | 2/2004 | Howard .................. 134/1.1 |
| 2004/0103914 A1 | * | 6/2004 | Cheng et al. ............. 134/1.1 |
| 2005/0181617 A1 | * | 8/2005 | Bosch .................... 438/710 |
| 2005/0221020 A1 | * | 10/2005 | Fukiage ................... 427/569 |
| 2006/0157448 A1 | * | 7/2006 | Magni et al. .............. 216/67 |
| 2007/0207275 A1 | * | 9/2007 | Nowak et al. ............. 427/569 |

FOREIGN PATENT DOCUMENTS

| | | |
|---|---|---|
| JP | 62-40728 | 2/1987 |
| JP | 2000-91327 | 3/2000 |
| JP | 2002043286 A * | 2/2002 |
| KR | 0145645 | 4/1998 |
| KR | 1999-027889 | 4/1999 |

OTHER PUBLICATIONS

Translation of JP 2002-043286.*

* cited by examiner

Primary Examiner — Alexander Markoff
(74) Attorney, Agent, or Firm — Oblon, Spivak, McClelland, Maier & Neustadt, L.L.P.

(57) ABSTRACT

A method of cleaning a substrate processing chamber that enables formation of an oxide film on a surface of a processing chamber inside component to be prevented. A substrate processing chamber 11 has therein a processing space S into which a wafer W is transferred and carries out reactive ion etching on the wafer W in the processing space S. The substrate processing chamber 11 has an upper electrode plate 38 that comprises silicon and a lower surface of which is exposed to the processing space S. A dry cleaning is carried out on the upper electrode plate 38 using oxygen radicals produced from oxygen gas introduced into the processing space S. An oxide removal processing is carried out on the upper electrode plate 38 using fluorine ions and fluorine radicals produced from carbon tetrafluoride gas introduced into the processing space S.

2 Claims, 7 Drawing Sheets

METHOD OF CLEANING SUBSTRATE PROCESSING CHAMBER, STORAGE MEDIUM, AND SUBSTRATE PROCESSING CHAMBER

BACKGROUND OF THE INVENTION

1. Field of the Invention

The present invention relates to a method of cleaning a substrate processing chamber, a storage medium, and a substrate processing chamber, and in particular relates to a method of cleaning a substrate processing chamber having an electrode made of silicon.

2. Description of the Related Art

Plasma processing apparatuses having a substrate processing chamber having therein a processing space into which is transferred a semiconductor wafer as a substrate, and a lower electrode that is disposed in the processing space and is connected to a radio frequency power source are known. In such a plasma processing apparatus, a processing gas is introduced into the processing space, and the lower electrode applies radio frequency electrical power into the processing space. Moreover, when a semiconductor wafer has been transferred into the processing space and mounted on the lower electrode, the introduced processing gas is turned into plasma by the radio frequency electrical power, whereby ions and so on are produced, and the semiconductor wafer is subjected to plasma processing such as etching through the ions and so on.

In such a plasma processing apparatus, in the case that a mixed gas of a deposit-producing reactant gas such as $C_4F_8$ gas and argon (Ar) gas is used as the processing gas, reaction product produced from the reactant gas becomes attached to an inner surface, e.g. a side inner wall (hereinafter referred to merely as the "side wall"), of the substrate processing chamber. The attached reaction product may peel away from the side wall, becoming particles. Such particles may become attached to a semiconductor wafer, causing defects in semiconductor devices manufactured from the semiconductor wafer. If it thus necessary to remove the reaction product attached to the inner surface of the substrate processing chamber.

From hitherto, as a method of removing reaction product attached to the inner surface, there has been known a method in which oxygen ($O_2$) gas is introduced into the processing space, oxygen ions and oxygen radicals are produced from the oxygen gas by radio frequency electrical power, and the reaction product is removed through reaction with the oxygen ions and oxygen radicals (see, for example, Japanese Laid-open Patent Publication (Kokai) No. S62-040728).

In recent years, with an object of improving plasma processing performance, there have been developed plasma processing apparatuses in which an upper electrode as a processing chamber inside component disposed facing the lower electrode in the processing space is made of silicon, and a DC power source is connected to the upper electrode. In such a plasma processing apparatus, if the reaction product removal method described above is implemented, then reaction product attached to the inner surface of the substrate processing chamber is reliably removed, but oxide such as silicon oxide ($SiO_2$) is produced through reaction of the silicon of the upper electrode with the oxygen ions and oxygen radicals. The oxide may become attached to the surface of the upper electrode so as to form an oxide film. The oxide film may peel away, becoming particles. Moreover, direct current cannot pass through the oxide film, and hence applying a DC voltage into the processing space becomes difficult. Furthermore, the oxide film may undergo dielectric breakdown through such a direct current, and hence making the state of the plasma in the processing space stable is difficult.

SUMMARY OF THE INVENTION

It is an object of the present invention to provide a method of cleaning a substrate processing chamber, a storage medium, and a substrate processing chamber, that enable formation of an oxide film on a surface of a processing chamber inside component to be prevented.

To attain the above object, according to a first aspect of the invention, there is provided a method of cleaning a substrate processing chamber that has therein a space into which a substrate is transferred and carries out plasma processing on the substrate in the space, the substrate processing chamber having a processing chamber inside component that comprises at least silicon and at least part of which is exposed to the space, the substrate processing chamber cleaning method comprising a first plasma processing step of carrying out attached matter removal processing on the processing chamber inside component using first plasma produced from oxygen gas introduced into the space and a second plasma processing step of carrying out oxide removal processing on the processing chamber inside component using second plasma produced from carbon tetrafluoride gas introduced into the space.

According to the first aspect of the invention, attached matter removal processing is carried out on the processing chamber inside component that comprises at least silicon using first plasma produced from oxygen gas introduced into the space to which at least part of the processing chamber inside component is exposed, and then oxide removal processing is carried out on the processing chamber inside component using second plasma produced from carbon tetrafluoride gas introduced into the space. Oxide that is produced from the first plasma and the silicon and becomes attached to the surface of the processing chamber inside component in the attached matter removal processing is removed by the second plasma. Formation of an oxide film on the surface of the processing chamber inside component can thus be prevented. As a result, particles can be prevented from being produced.

Preferably, the processing chamber inside component is an electrode that is disposed facing the substrate transferred into the space, and is connected to a direct current power source.

According to the first aspect of the invention, the processing chamber inside component is an electrode that is disposed facing the substrate transferred into the space, and is connected to a direct current power source. As a result, formation of an oxide film on the surface of the electrode can be prevented, whereby oxide film dielectric breakdown can be prevented from occurring, and hence the state of plasma in the space can be made stable.

Preferably, a pressure in the space in the first plasma processing step is set in a range of 26.7 Pa to 80.0 Pa.

According to the first aspect of the invention, the pressure in the space in the first plasma processing step is set in a range of 26.7 Pa to 80.0 Pa. The main factor in the occurrence of oxide attached to the surface of the processing chamber inside component is reaction between silicon and oxygen ions, but by increasing the pressure in the space, the number of oxygen ions reaching the surface of the processing chamber inside component is reduced. The reaction between the silicon and the oxygen ions can thus be suppressed, and hence formation of an oxide film on the surface of the processing chamber inside component can be prevented reliably.

Preferably, a difference between a potential produced on a surface of the processing chamber inside component due to radio frequency electrical power of a frequency followable by ions in the first plasma that is applied into the space in the first plasma processing step and a potential in the space is set to not less than 150 V.

According to the first aspect of the invention, the difference between a potential produced on the surface of the processing chamber inside component due to radio frequency electrical power of a frequency followable by ions in the first plasma that is applied into the space in the first plasma processing step and a potential in the space is set to not less than 150 V. If the difference between the potential produced on the surface of the processing chamber inside component and the potential in the space is high, then the sputtering yield for the surface of the processing chamber inside component by oxygen ions increases. Oxide attached to the surface of the processing chamber inside component can thus be removed through sputtering by oxygen ions, and hence formation of an oxide film on the surface of the processing chamber inside component can be prevented more reliably.

Preferably, a magnitude of radio frequency electrical power of a frequency followable by ions in the first plasma that is applied into the space in the first plasma processing step is set to 0 W.

According to the first aspect of the invention, the magnitude of radio frequency electrical power of a frequency followable by ions in the first plasma that is applied into the space in the first plasma processing step is set to 0 W. As a result, the difference between the potential produced on the surface of the processing chamber inside component and the potential in the space can be made low, and hence the number of oxygen ions reaching the surface of the processing chamber inside component can be reduced. Formation of an oxide film on the surface of the processing chamber inside component can thus be prevented more reliably.

Preferably, a magnitude of radio frequency electrical power of a frequency not followable by ions in the first plasma that is applied into the space in the first plasma processing step is set to not more than 500 W.

According to the first aspect of the invention, the magnitude of radio frequency electrical power of a frequency not followable by ions in the first plasma that is applied into the space in the first plasma processing step is set to not more than 500 W. As a result, the density of oxygen ions produced in the space can be reduced, and hence the number of oxygen ions reaching the surface of the processing chamber inside component can be reduced. Formation of an oxide film on the surface of the processing chamber inside component can thus be prevented more reliably.

To attain the above object, according to a second aspect of the invention, there is provided a computer-readable storage medium storing a program for causing a computer to implement a method of cleaning a substrate processing chamber that has therein a space into which a substrate is transferred and carries out plasma processing on the substrate in the space, the substrate processing chamber having a processing chamber inside component that comprises at least silicon and at least part of which is exposed to the space, the program comprising a first plasma processing module for carrying out attached matter removal processing on the processing chamber inside component using first plasma produced from oxygen gas introduced into the space and a second plasma processing module for carrying out oxide removal processing on the processing chamber inside component using second plasma produced from carbon tetrafluoride gas introduced into the space.

To attain the above object, according to a third aspect of the invention, there is provided a substrate processing chamber that has therein a space into which a substrate is transferred and carries out plasma processing on the substrate in the space, the substrate processing chamber having a processing chamber inside component that comprises at least silicon and at least part of which is exposed to the space, the substrate processing chamber comprising a gas introducing apparatus that introduces a predetermined gas into the space and an electrode that produces plasma by applying radio frequency electrical power into the space into which the gas has been introduced, wherein in response to oxygen gas being introduced into the space, the electrode produces first plasma by applying radio frequency electrical power into the space and in response to the first plasma being removed from the space and carbon tetrafluoride gas being introduced into the space, the electrode produces second plasma by applying radio frequency electrical power into the space.

According to the third aspect of the invention, oxygen gas is introduced into the space to which is exposed at least part of the processing chamber inside component that comprises at least silicon, first plasma is produced from the introduced oxygen gas, after the first plasma has been removed carbon tetrafluoride gas is introduced into the space, and once the carbon tetrafluoride gas has been introduced into the space second plasma is produced through radio frequency electrical power being applied into the space. The first plasma removes attached matter that has become attached to the surface of the processing chamber inside component, and the second plasma removes oxide that is produced from the first plasma and the silicon and becomes attached to the surface of the processing chamber inside component. Formation of an oxide film on the surface of the processing chamber inside component can thus be prevented. As a result, particles can be prevented from being produced.

The above and other objects, features, and advantages of the invention will become more apparent from the following detailed description taken in conjunction with the accompanying drawings.

BRIEF DESCRIPTION OF THE DRAWINGS

FIG. 5A shows a case that an electrode plate surface-space potential difference is 0, FIG. 5B shows a case that the electrode plate surface-space potential difference is approximately 100 V, and FIG. 5C shows a case that the electrode plate surface-space potential difference is not less than 150 V.

DESCRIPTION OF THE PREFERRED EMBODIMENTS

The present invention will now be described with reference to the drawings showing embodiments thereof.

First, a plasma processing apparatus to which is applied substrate processing chamber cleaning methods according to embodiments of the present invention, described later, will be described.

Figure 1:
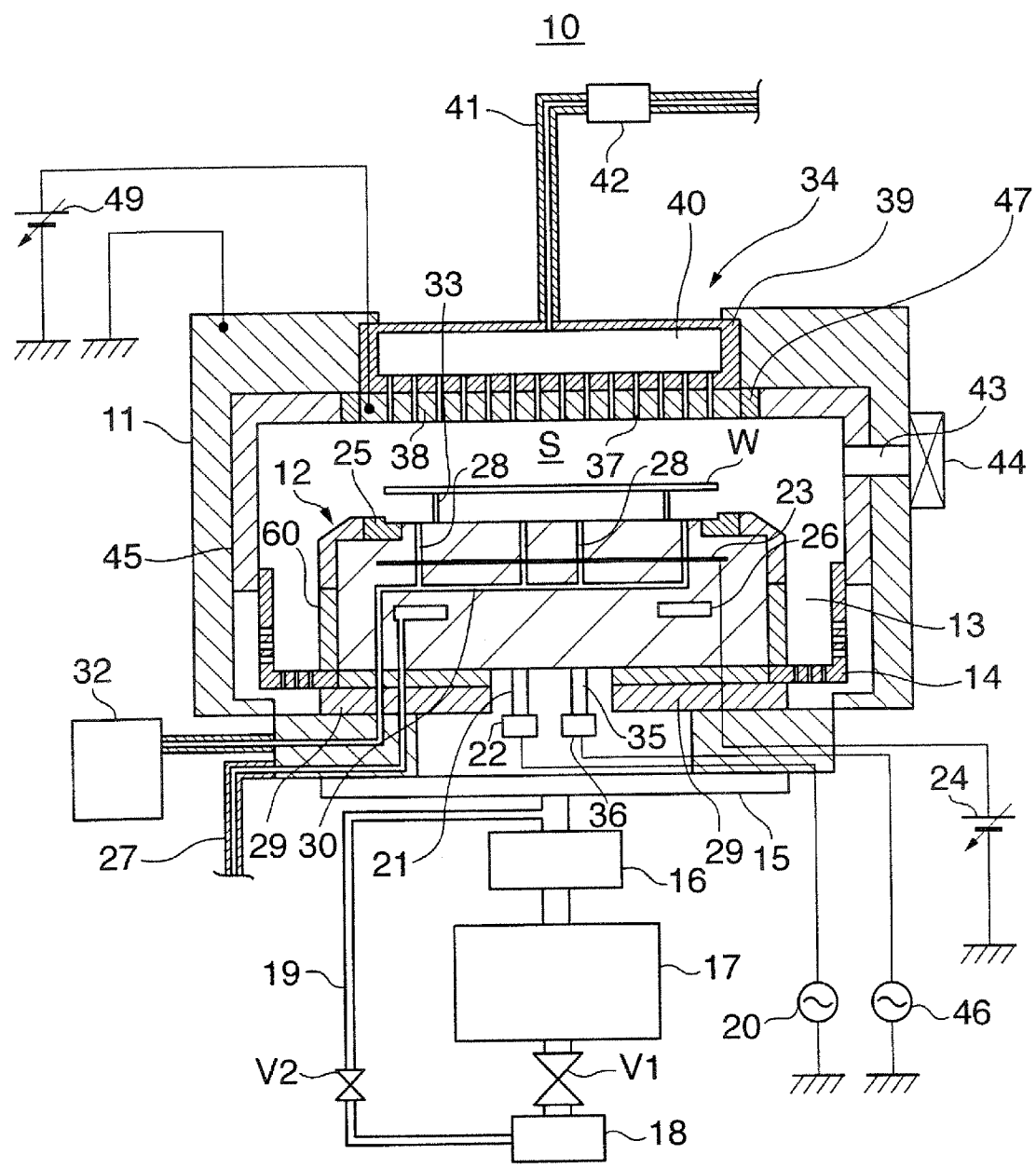
FIG. 1 is a sectional view schematically showing the construction of a plasma processing apparatus to which is applied substrate processing chamber cleaning methods according to embodiments of the present invention.

FIG. 1 is a sectional view schematically showing the construction of a plasma processing apparatus to which is applied substrate processing chamber cleaning methods according to embodiments of the present invention. The plasma processing apparatus is constructed so as to carry out RIE (reactive ion etching) or ashing on semiconductor wafers W as substrates.

As shown in FIG. 1, the plasma processing apparatus 10 has a cylindrical substrate processing chamber 11, the substrate processing chamber 11 having a processing space S therein. A cylindrical susceptor 12 is disposed in the substrate processing chamber 11 as a stage on which is mounted a semiconductor wafer W (hereinafter referred to merely as a "wafer W") having a diameter of, for example, 300 mm. An inner wall surface of the substrate processing chamber 11 is covered with a side wall member 45. The side wall member 45 is made of aluminum, a surface thereof facing the processing space S being coated with yttria ($Y_2O_3$). Moreover, a wall portion of the substrate processing chamber 11 is electrically grounded, and the susceptor 12 is installed via an insulating member 29 on a bottom portion of the substrate processing chamber 11. A side surface of the susceptor 12 is covered with a susceptor side surface covering member 60.

In the plasma processing apparatus 10, an exhaust path 13 that acts as a flow path through which gas molecules above the susceptor 12 are exhausted to the outside of the substrate processing chamber 11 is formed between an inner side wall of the substrate processing chamber 11 and the side surface of the susceptor 12. An annular baffle plate 14 that prevents leakage of plasma is disposed part way along the exhaust path 13. A space in the exhaust path 13 downstream of the baffle plate 14 bends round below the susceptor 12, and is communicated with an adaptive pressure control valve (hereinafter referred to as the "APC valve") 15, which is a variable butterfly valve. The APC valve 15 is connected via an isolator 16 to a turbo-molecular pump (hereinafter referred to as the "TMP") 17, which is an exhausting pump for evacuation. The TMP 17 is connected via a valve V1 to a dry pump (hereinafter referred to as the "DP") 18, which is also an exhausting pump. The exhaust flow path comprised of the APC valve 15, the isolator 16, the TMP 17, the valve V1, and the DP 18 is used for controlling the pressure in the substrate processing chamber 11, more specifically the processing space S, using the APC valve 15, and also for reducing the pressure in the substrate processing chamber 11 down to a substantially vacuum state using the TMP 17 and the DP 18.

Moreover, piping 19 is connected from between the isolator 16 and the APC valve 15 to the DP 18 via a valve V2. The piping 19 and the valve V2 bypass the TMP 17, and are used for roughing the substrate processing chamber 11 using the DP 18.

A radio frequency power source 20 is connected to the susceptor 12 via a feeder rod 21 and a matcher 22. The radio frequency power source 20 supplies radio frequency electrical power of a relatively high frequency, for example 40 MHz, to the susceptor 12. The susceptor 12 thus acts as a lower electrode. The matcher 22 reduces reflection of the radio frequency electrical power from the susceptor 12 so as to maximize the efficiency of the supply of the radio frequency electrical power into the susceptor 12. The susceptor 12 applies into the processing space S the 40 MHz radio frequency electrical power supplied from the radio frequency power source 20.

Moreover, another radio frequency power source 46 is connected to the susceptor 12 via a feeder rod 35 and a matcher 36. The other radio frequency power source 46 supplies radio frequency electrical power of a relatively low frequency, for example 2 MHz, to the susceptor 12. The matcher 36 has a similar function to the matcher 22. The susceptor 12 applies into the processing space S the 2 MHz radio frequency electrical power supplied from the other radio frequency power source 46. At this time, a potential due to the 2 MHz radio frequency electrical power applied into the processing space S is produced on surfaces of the side wall member 45, the susceptor side surface covering member 60, and an upper electrode plate 38, described below, facing the processing space S. This potential has a frequency of 2 MHz. A difference between the potential produced on the surface of the upper electrode plate 38 and so on and a potential in the processing space S (hereinafter referred to merely as the "electrode plate surface-space potential difference") thus also fluctuates at 2 MHz. It is known that cations, for example argon ions ($Ar^+$) having an electron density (Ne) of $10^{10}$ $cm^{-3}$ can follow potential difference fluctuations up to approximately 3.3 MHz. Such cations can thus follow the fluctuations in the electrode plate surface-space potential difference, and hence a number of cations corresponding to the electrode plate surface-space potential difference collides with the surface of the upper electrode plate 38 and so on. Specifically, when the electrode plate surface-space potential difference is high, a large number of cations collides with the surface of the upper electrode plate 38 and so on, whereas when the electrode plate surface-space potential difference is 0 V, hardly any cations collide with the surface of the upper electrode plate 38 and so on. Meanwhile, because the radio frequency electrical power supplied to the susceptor 12 from the radio frequency power source 20 is at 40 MHz, if a potential is produced on the surface of the upper electrode plate 38 due to this radio frequency electrical power, then the difference between this potential and the potential in the processing space S fluctuates at 40 MHz. However, the cations cannot follow a potential difference fluctuating at 40 MHz, and hence the cations substantially follow a DC component of the radio frequency electrical power fluctuating at 40 MHz, and thus the electrode plate surface-space potential difference acting on the cations due to the radio frequency electrical power fluctuating at 40 MHz is only approximately half of the electrode plate surface-space potential difference acting on the cations due to the radio frequency electrical power fluctuating at 2 MHz. Controlling the number of cations colliding with the surface of the upper electrode plate 38 and so on due to the radio frequency electrical power fluctuating at 40 MHz is thus not effective.

A disk-shaped ESC electrode plate 23 comprised of an electrically conductive film is provided in an upper portion of the susceptor 12. An ESC DC power source 24 is electrically connected to the ESC electrode plate 23. A wafer W is attracted to and held on an upper surface of the susceptor 12 through a Johnsen-Rahbek force or a Coulomb force generated by a DC voltage applied to the ESC electrode plate 23 from the ESC DC power source 24. Moreover, an annular focus ring 25 is provided on an upper portion of the susceptor 12 so as to surround the wafer W attracted to and held on the upper surface of the susceptor 12. The focus ring 25 is exposed to the processing space S, and focuses plasma in the processing space S toward a surface of the wafer W, thus improving the efficiency of the RIE or ashing.

An annular coolant chamber 26 that extends, for example, in a circumferential direction of the susceptor 12 is provided inside the susceptor 12. A coolant, for example cooling water or a Galden (registered trademark) fluid, at a predetermined temperature is circulated through the coolant chamber 26 via coolant piping 27 from a chiller unit (not shown). A processing temperature of the wafer W attracted to and held on the upper surface of the susceptor 12 is controlled through the temperature of the coolant.

A plurality of heat-transmitting gas supply holes 28 are provided in a portion of the upper surface of the susceptor 12 on which the wafer W is attracted and held (hereinafter referred to as the "attracting surface") The peripheral heat-transmitting gas supply holes 28 are connected to a heat-transmitting gas supply unit 32 by a heat-transmitting gas supply line 30 provided inside the susceptor 12. The heat-transmitting gas supply unit 32 supplies helium gas as a heat-transmitting gas via the heat-transmitting gas supply holes 28 into a gap between the attracting surface and a rear surface of the wafer W.

A plurality of pusher pins 33 are provided in the attracting surface of the susceptor 12 as lifting pins that can be made to project out from the upper surface of the susceptor 12. The pusher pins 33 are connected to a motor (not shown) by a ball screw (not shown), and can be made to project out from the attracting surface through rotational motion of the motor, which is converted into linear motion by the ball screw. The pusher pins 33 are housed inside the susceptor 12 when a wafer W is being attracted to and held on the attracting surface so that the wafer W can be subjected to the RIE or ashing, and are made to project out from the upper surface of the susceptor 12 so as to lift the wafer W up away from the susceptor 12 when the wafer W is to be transferred out from the substrate processing chamber 11 after having been subjected to the RIE or ashing.

A gas introducing shower head 34 (gas introducing apparatus) is disposed in a ceiling portion of the substrate processing chamber 11 such as to face the susceptor 12. The gas introducing shower head 34 is comprised of an electrode plate support 39 made of an insulating material having a buffer chamber 40 formed therein, and the upper electrode plate 38 (processing chamber inside component) which is supported by the electrode plate support 39. A lower surface (surface) of the upper electrode plate 38 is exposed to the processing space S. The upper electrode plate 38 is a disk-shaped member made of an electrically conductive material such as silicon. A peripheral portion of the upper electrode plate 38 is covered with an annular insulating member 47 made of an insulating material. That is, the upper electrode plate 38 is electrically insulated by the electrode plate support 39 and the insulating member 47 from the wall of the substrate processing chamber 11, which is at ground potential.

A processing gas introducing pipe 41 is connected from a processing gas supply unit (not shown) to the buffer chamber 40 in the electrode plate support 39. A piping insulator 42 is disposed part way along the processing gas introducing pipe 41. Moreover, the gas introducing shower head 34 has therein a plurality of gas holes 37 that communicate the buffer chamber 40 to the processing space S. A processing gas supplied from the processing gas introducing pipe 41 into the buffer chamber 40 is supplied by the gas introducing shower head 34 into the processing space S via the gas holes 37.

The upper electrode plate 38 is electrically connected to a DC power source 49, and a negative DC voltage is applied to the upper electrode plate 38. Here, there is no need to dispose a matcher between the upper electrode plate 38 and the DC power source 49, and hence the structure of the plasma processing apparatus 10 can be made to be simpler than in the case that a radio frequency power source is connected to the upper electrode plate via a matcher. Moreover, the upper electrode plate 38 remains at a negative potential with no fluctuations, and hence a state of drawing in only cations can be maintained, so that there is no loss of electrons from the processing space S. There is thus no reduction in the number of electrons in the processing space S, and as a result the efficiency of the plasma processing such as RIE or ashing can be improved.

A transfer port 43 for the wafers W is provided in the side wall of the substrate processing chamber 11 in a position at the height of a wafer W that has been lifted up from the susceptor 12 by the pusher pins 33. A gate valve 44 for opening and closing the transfer port 43 is provided in the transfer port 43.

In the substrate processing chamber 11 of the plasma processing apparatus 10, through the susceptor 12 applying radio frequency electrical power into the processing space S which is the space between the susceptor 12 and the upper electrode plate 38 as described above, the processing gas supplied from the gas introducing shower head 34 into the processing space S is turned into high-density plasma so that cations and radicals are produced, whereby the wafer W is subjected to the RIE or ashing by the cations and radicals.

Operation of the component elements of the plasma processing apparatus 10 described above is controlled in accordance with a program for the RIE or ashing by a CPU of a control unit (not shown) of the plasma processing apparatus 10.

When a wafer W is subjected to the RIE in the plasma processing apparatus 10 described above, if a mixed gas of a deposit-producing reactant gas such as $C_4F_8$ gas and argon gas is used, then reaction product produced from the reactant gas becomes attached to the surface of the upper electrode plate 38, the surface of the side wall member 45, and the surface of the susceptor side surface covering member 60. To remove the reaction product attached to the surfaces of these components, dry cleaning is implemented as described in detail below.

In the dry cleaning, oxygen gas is introduced from the gas introducing shower head 34 into the processing space S, and 40 MHz radio frequency electrical power and 2 MHz radio frequency electrical power are applied by the susceptor 12 into the processing space S into which the oxygen gas has been introduced. In the processing space S, oxygen ions and oxygen radicals are produced from the oxygen gas mainly due to the 40 MHz radio frequency electrical power. The oxygen ions and oxygen radicals react with the reaction product so as to remove the reaction product.

Upon carrying out the dry cleaning in the plasma processing apparatus 10, an oxide film made of silicon oxide is formed on the surface of the upper electrode plate 38 made of silicon as described earlier. The surface of the upper electrode plate 38 having the oxide film formed thereon becomes cloudy. Prior to the present invention, as an investigation into conditions under which formation of such an oxide film in the dry cleaning can be suppressed, the present inventors observed the state of oxide film formation on the surface of the upper electrode plate 38 upon changing the conditions under which the dry cleaning is carried out, for example the pressure in the processing space S, the magnitude (power) of the 40 MHz radio frequency electrical power applied into the processing space S, and the electrode plate surface-space potential difference (shown as "potential difference between processing space and upper electrode plate" in Table 3), and as a result have obtained the observation results shown in Tables 1 to 3 below.

TABLE 1

| Pressure in processing space | | Upper electrode plate |
|---|---|---|
| Pa | (mTorr) | |
| 6.67 | (50) | Becomes cloudy |
| 13.3 | (100) | Becomes a little cloudy |
| 26.7 | (200) | No cloudiness |

TABLE 2

| 40 MHz power (W) | Upper electrode plate |
|---|---|
| 2000 | Becomes cloudy |
| 500 | No cloudiness |

TABLE 3

| Potential difference between processing space and upper electrode plate (V) | Upper electrode plate |
|---|---|
| 0 | No cloudiness |
| 100 | Becomes cloudy |
| 150 | No cloudiness |

That is, the present inventors have found that the higher the pressure in the processing space S, the less readily an oxide film is formed; the smaller the magnitude of the 40 MHz radio frequency electrical power applied into the processing space S, the less readily an oxide film is formed; and if the electrode plate surface-space potential difference is small, then an oxide film is not readily formed. Specifically, the present inventors have found that if the pressure in the processing space S is not less than 26.7 Pa (200 mTorr), then an oxide film is not formed on the surface of the upper electrode plate 38; if the magnitude of the 40 MHz radio frequency electrical power applied into the processing space S is not more than 500 W, then an oxide film is not formed on the surface of the upper electrode plate 38, and if the electrode plate surface-space potential difference is 0 V, then an oxide film is not formed on the surface of the upper electrode plate 38.

Next, the present inventors carried out studies into the mechanism by which oxide film formation occurs on the surface of the upper electrode plate 38. Specifically, the present inventors investigated whether the main factor in the oxide film formation is oxygen radicals, or oxygen ions.

Figure 2:
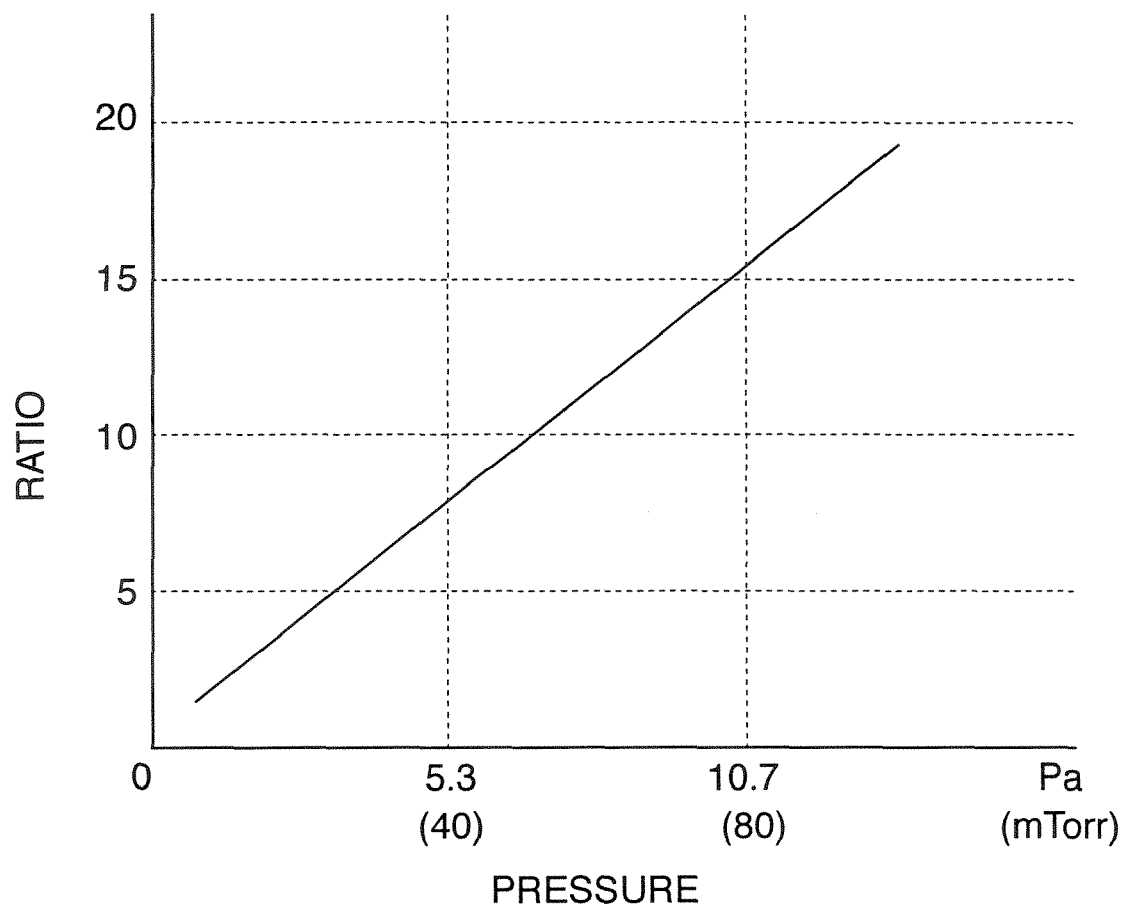
FIG. 2 is a graph showing changes in a ratio of oxygen radicals to argon radicals in plasma upon changing a pressure in a processing space.

First, a predetermined amount of oxygen gas and a trace amount of argon gas were introduced into the processing space S in the plasma processing apparatus 10, and 40 MHz radio frequency electrical power and 2 MHz radio frequency electrical power were applied into the processing space S so as to produce plasma. At this time, the ratio of oxygen radicals to argon radicals in the plasma was measured while changing the pressure in the processing space S. As a result, as shown by the graph in FIG. 2, it was found that the ratio of oxygen radicals to argon radicals increases as the pressure in the processing space S increases. That is, it was found that the higher the pressure in the processing space S, the greater the number of oxygen radicals.

Figure 3:
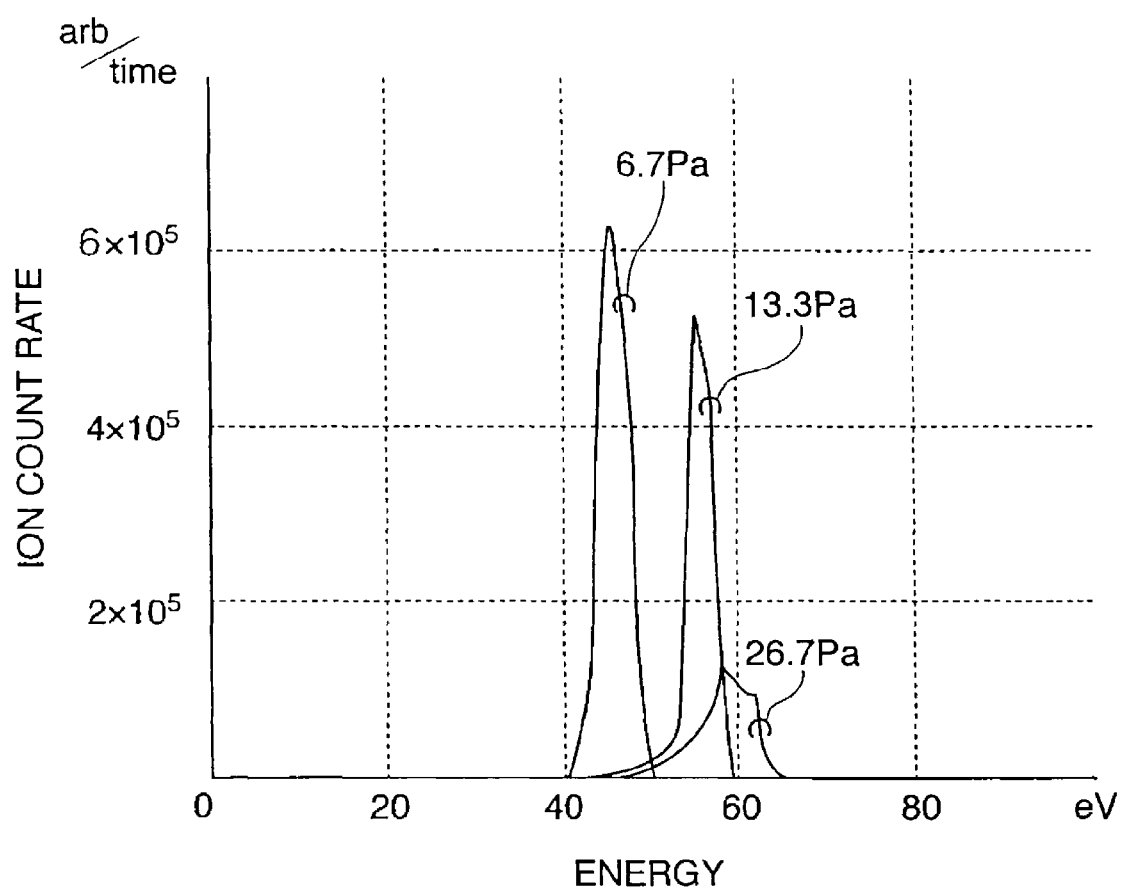
FIG. 3 is a graph showing a number of oxygen ions reaching a side wall member per unit time upon changing the pressure in the processing space.

Moreover, a predetermined amount of oxygen gas and a trace amount of argon gas were introduced into the processing space S in the plasma processing apparatus 10, and 40 MHz radio frequency electrical power and 2 MHz radio frequency electrical power were applied into the processing space S so as to produce plasma. At this time, the number of oxygen ions reaching the side wall member 45 per unit time was measured while changing the pressure in the processing space S (three pressures: 6.7 Pa (50 mTorr), 13.3 Pa (100 mTorr), and 26.7 Pa (200 mTorr)). At this time, the energy distribution of the oxygen ions was also measured. As a result, as shown by the graph in FIG. 3, it was found that the number of oxygen ions reaching the side wall member 45 per unit time decreases as the pressure in the processing space S increases. That is, it was found that the higher the pressure in the processing space S, the lower the number of oxygen ions.

Regarding a mechanism explaining why the number of oxygen ions reaching the side wall member 45 decreases as the pressure in the processing space S increases, giving a precise explanation is difficult, but based on common general technical knowledge in the technical field to which the present invention pertains, the present inventors have inferred the two hypotheses described below.

(1) It is known that if the pressure in a processing space in which plasma has been produced is increased, then the plasma becomes unevenly distributed toward the vicinity of an electrode applying the radio frequency electrical power into the processing space. In the processing space S, the plasma produced from the oxygen gas is likewise unevenly distributed toward the vicinity of the susceptor 12, and as a result the plasma becomes sparse in the vicinity of the side wall member 45, and hence the number of oxygen ions is reduced in the vicinity of the side wall member 45. The number of oxygen ions reaching the side wall member 45 thus decreases.

(2) The flux of ions flowing onto the wall of the processing chamber (the ion flux) $\gamma_i$ is given by the following formula.

$$\gamma_i = 0.61 \times N_i \times (e \times Te/M)^{1/2}$$

$N_i$ represents the ion density in a sheath produced in the vicinity of the side wall member 45, Te represents the electron temperature, and M represents the ion mass.

Here, it is known that if the pressure in the processing space increases, then the electron temperature decreases. Consequently, from the above formula, if the pressure in the processing space increases, then the flux of ions flowing onto the wall of the processing chamber decreases. That is, if the pressure in the processing space S increases, then the number of oxygen ions reaching the side wall member 45 decreases.

As described above, if the pressure in the processing space S is reduced, then an oxide film is more readily formed (see Table 1), and moreover the number of oxygen ions increases; it has thus been found that there is a close relationship between the oxide film formation and the number of oxygen ions, i.e. oxygen ions are the main factor in the oxide film formation.

Moreover, from the above findings, it can be seen that to suppress formation of an oxide film on the surface of the upper electrode plate 38, it is preferable to reduce the number of oxygen ions reaching the surface of the upper electrode plate 38, i.e. it is preferable to reduce the density of oxygen ions in the processing space S.

As methods of reducing the number of oxygen ions reaching the surface of the upper electrode plate 38, in addition to the method described above of increasing the pressure in the processing space S, one can think of a method of making the electrode plate surface-space potential difference be 0, and a method of reducing the magnitude of the 40 MHz radio frequency electrical power. These methods are described below.

(1) Method of Making Electrode Plate Surface-space Potential Difference be 0 V

In the case that the electrode plate surface-space potential difference is 0 V, oxygen ions present in the processing space S are not drawn onto the upper electrode plate 38, and hence hardly any oxygen ions reach the surface of the upper electrode plate 38, and as a result the number of oxygen ions reaching the surface of the upper electrode plate 38 can be reduced. As shown in above Table 3, in the case that the electrode plate surface-space potential difference was 0 V, an oxide film was not formed on the surface of the upper electrode plate 38, confirming that this method is effective in preventing formation of an oxide film on the surface of the upper electrode plate 38.

(2) Reducing the Magnitude of the 40 MHz Radio Frequency Electrical Power

If the magnitude of the 40 MHz radio frequency electrical power is reduced, then the amount of plasma produced in the processing space S, and hence the number of oxygen ions, is reduced. As a result, the number of oxygen ions reaching the surface of the upper electrode plate 38 from the processing space S can be reduced. As shown in above Table 2, in the case that the magnitude of the 40 MHz radio frequency electrical power was made to be not more than 500 W, an oxide film was not formed on the surface of the upper electrode plate 38, confirming that this method is also effective in preventing formation of an oxide film on the surface of the upper electrode plate 38.

Figure 4:
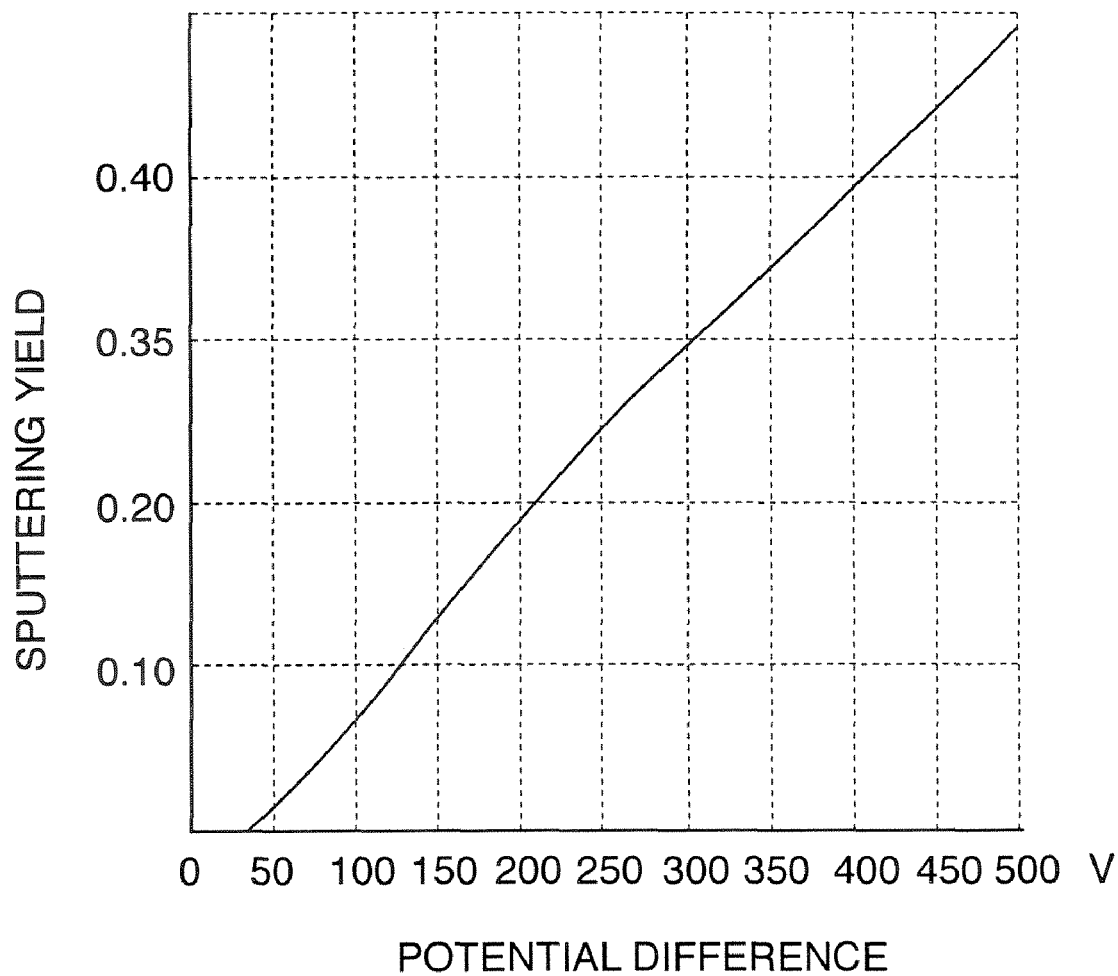
FIG. 4 shows changes in an argon radical sputtering yield upon changing a potential difference.

Meanwhile, as shown in above Table 3, it has been found that an oxide film is also not formed on the surface of the upper electrode plate 38 if the electrode plate surface-space potential difference is not less than 150 V. This finding is at odds with the method described above of making the electrode plate surface-space potential difference be 0 V, and hence focusing on sputtering of the surface of the upper electrode plate 38 by oxygen ions, the present inventors carried out a simulation of changes in the sputtering yield upon changing the potential difference using a computational model for argon atoms which have a atom weight close to a molecular weight of oxygen molecules. As a result, it was found that, as shown by the graph in FIG. 4, sputtering does not occur up to a certain potential difference from 0 V, and beyond this certain potential difference the sputtering yield increases as the potential difference increases.

Figure 5A:
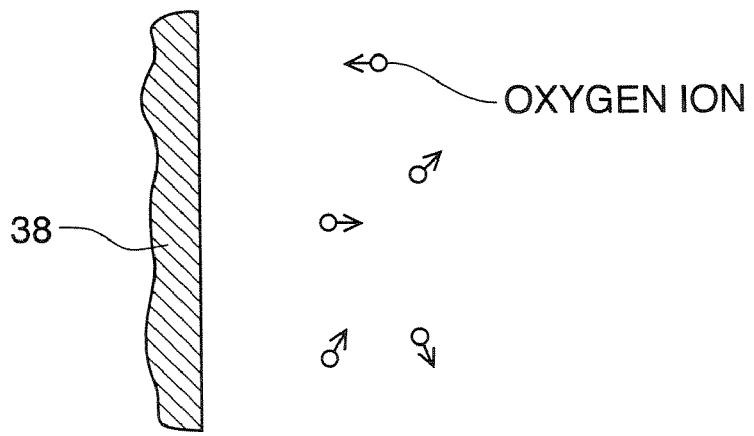
FIGS. 5A to 5C are views showing collisions between oxygen ions and an upper electrode plate.

From the above, the present inventors inferred the following hypothesis. That is, in the case that the electrode plate surface-space potential difference is 0 V, as described above, hardly any oxygen ions reach the surface of the upper electrode plate 38, and hence an oxide film is not formed (FIG. 5(A)).

Figure 5B:
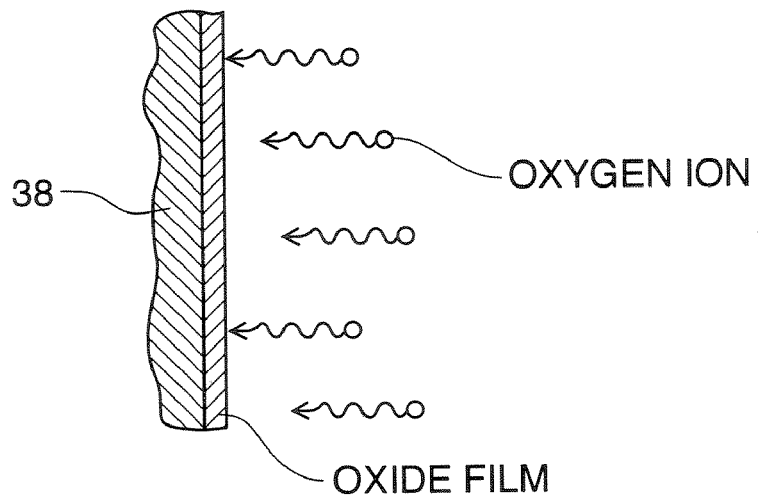

In the case that the electrode plate surface-space potential difference is approximately 100 V, only low-energy oxygen ions are drawn onto the surface of the upper electrode plate 38. Here, the energy of collision between the oxygen ions and the surface of the upper electrode plate 38 is low, and hence the oxygen ions become attached to the surface of the upper electrode plate 38 and react with the silicon of the upper electrode plate 38 to form oxide. As a result, an oxide film is formed on the surface of the upper electrode plate 38 (FIG. 5(B)).

Figure 5C:
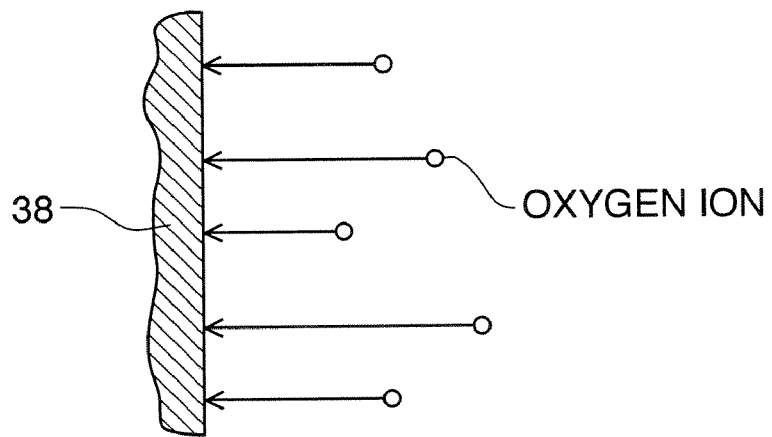

In the case that the electrode plate surface-space potential difference is not less than 150 V, not only low-energy oxygen ions but also high-energy oxygen ions are drawn onto the surface of the upper electrode plate 38. The low-energy oxygen ions that reach the surface of the upper electrode plate 38 become attached to the surface of the upper electrode plate 38 and react with the silicon of the upper electrode plate 38 to form oxide; however, because the energy of collision between the high-energy oxygen ions and the surface of the upper electrode plate 38 is high, the oxide is removed through sputtering by the high-energy oxygen ions. As a result, an oxide film is not formed on the surface of the upper electrode plate 38 (FIG. 5(C)).

The present invention is based on the above findings.

A substrate processing chamber cleaning method according to a first embodiment of the present invention will now be described.

Figure 6:
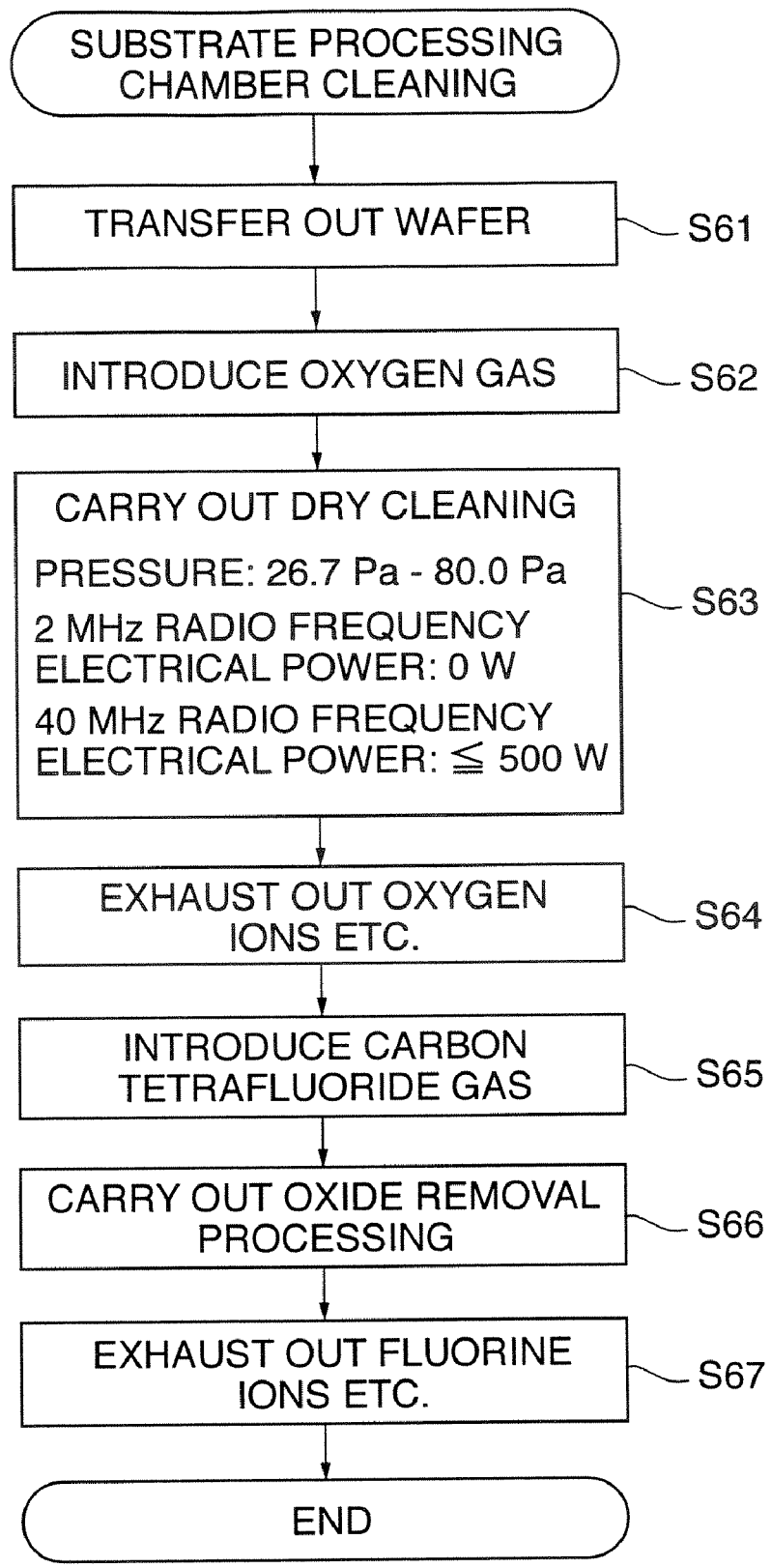
FIG. 6 is a flowchart of a substrate processing chamber cleaning method according to a first embodiment of the present invention.

FIG. 6 is a flowchart of the substrate processing chamber cleaning method according to the present embodiment.

As shown in FIG. 6, first, in the plasma processing apparatus 10 in which reaction product has become attached to the surface of the upper electrode plate 38, a wafer W that has been subjected to RIE is transferred out from the substrate processing chamber 11 (step S61). Next, oxygen gas is introduced from the gas introducing shower head 34 into the processing space S (step S62), and moreover 40 MHz radio frequency electrical power is applied into the processing space S so as to produce plasma, whereby dry cleaning (attached matter removal processing) is carried out (step S63) (first plasma processing step).

In step S63, the pressure in the processing space S is set in a range of 26.7 Pa to 80.0 Pa using the APC valve 15. The reason that the upper limit of the pressure is set to 80.0 Pa is that if the pressure exceeds 80.0 Pa, then the density of oxygen radicals produced from the oxygen gas becomes too high, and hence sealing members such as O-rings used for sealing piping or a lid of the substrate processing chamber 11 (a chamber lid) are damaged too much. Moreover, the magnitude of the 2 MHz radio frequency electrical power supplied to the susceptor 12 from the other radio frequency power source 46 is set to 0 W. That is, 2 MHz radio frequency electrical power is not supplied to the susceptor 12. Here, a potential that would be produced due to the 2 MHz radio frequency electrical power is not produced on the surface of the upper electrode plate 38, and hence the electrode plate surface-space potential difference is 0 V. Furthermore, the magnitude of the 40 MHz radio frequency electrical power supplied to the susceptor 12 from the radio frequency power source 20 is set to not more than 500 W.

In step S63, oxygen ions and oxygen radicals are produced from the oxygen gas due to the 40 MHz radio frequency electrical power in the processing space S. Of these, the oxygen radicals (first plasma) react with the reaction product attached to the surface of the upper electrode plate 38 so that the reaction product is decomposed and thus removed. Meanwhile, because the pressure in the processing space S is set in a range of 26.7 Pa to 80.0 Pa, the electrode plate surface-space potential difference is 0 V, and the magnitude of the 40 MHz radio frequency electrical power is set to not more than 500 W, the number of oxygen ions reaching the surface of the upper electrode plate 38 is low, and hence formation of an oxide film on the surface of the upper electrode plate 38 is suppressed. Note, however, that in step S63, a small number of high-energy oxygen ions may reach the surface of the upper electrode plate 38, and as a result a trace amount of oxide may be produced through reaction between the oxygen ions and the silicon of the upper electrode plate 38, and may become attached to the surface of the upper electrode plate 38.

Next, the oxygen ions, the oxygen radicals, gas produced through the decomposition of the reaction product, and so on in the processing space S are exhausted out through the exhaust flow path of the plasma processing apparatus 10 (step S64), and then carbon tetrafluoride ($CF_4$) gas is introduced from the gas introducing shower head 34 into the processing space S (step S65), and moreover 40 MHz radio frequency electrical power and 2 MHz radio frequency electrical power are applied into the processing space S so as to produce plasma; whereby oxide removal processing, described below, is carried out (step S66) (second plasma processing step).

In step S66, fluorine ions and fluorine radicals are produced from the carbon tetrafluoride gas due to the 40 MHz radio frequency electrical power and the 2 MHz radio frequency electrical power in the processing space S. The fluorine ions and fluorine radicals (second plasma) react with the oxide attached to the surface of the upper electrode plate 38 so that the oxide is decomposed and thus removed.

Next, the fluorine ions, the fluorine radicals, gas produced through the decomposition of the oxide, and so on in the processing space S are exhausted out through the exhaust flow path of the plasma processing apparatus 10 (step S67), whereupon the present processing comes to an end.

According to the processing of FIG. 6 described above, the upper electrode plate 38 made of silicon is subjected to dry cleaning by oxygen radicals produced from oxygen gas introduced into the processing space S to which the surface of the upper electrode plate 38 is exposed, and then the upper electrode plate 38 is subjected to oxide removal processing by fluorine ions and fluorine radicals produced from carbon tetrafluoride gas introduced into the processing space S. Oxide that is produced from the oxygen radicals and the silicon and becomes attached to the surface of the upper electrode plate 38 in the dry cleaning is decomposed and thus removed by the fluorine ions and fluorine radicals. Formation of an oxide film on the surface of the upper electrode plate 38 can thus be prevented. As a result, particles can be prevented from being produced, and moreover oxide film dielectric breakdown can be prevented from occurring, and hence the state of the plasma in RIE or the like in the processing space S can be made stable.

In the processing of FIG. 6 described above, in the dry cleaning (step S63), the pressure in the processing space S is set in a range of 26.7 Pa to 80.0 Pa, the magnitude of the 2 MHz radio frequency electrical power is set to 0 W so that the electrode plate surface-space potential difference is 0 V, and the magnitude of the 40 MHz radio frequency electrical power is set to not more than 500 W, whereby the number of oxygen ions reaching the surface of the upper electrode plate 38 is reduced. Reaction between the silicon and the oxygen ions can thus be suppressed, and hence formation of an oxide film on the surface of the upper electrode plate 38 can be prevented reliably.

In the processing of FIG. 6 described above, in the oxide removal processing (step S65), carbon tetrafluoride gas is introduced from the gas introducing shower head 34 into the processing space S; however, the introduced gas is not limited thereto, but rather may also be a straight chain saturated fluorocarbon gas represented by $C_xF_{2x+2}$, for example $C_2F_6$ or $C_3F_8$.

Next, a substrate processing chamber cleaning method according to a second embodiment of the present invention will be described.

In the present embodiment, the construction and operation are basically the same as in the first embodiment described above, the only difference being that the pressure in the processing space S, the value of the electrode plate surface-space potential difference, and the magnitudes of the 40 MHz radio frequency electrical power and the 2 MHz radio frequency electrical power in the dry cleaning are different to in the first embodiment described above. Description of aspects of the construction that are the same as in the first embodiment will thus be omitted, only aspects of the operation that are different to in the first embodiment being described below.

Figure 7:
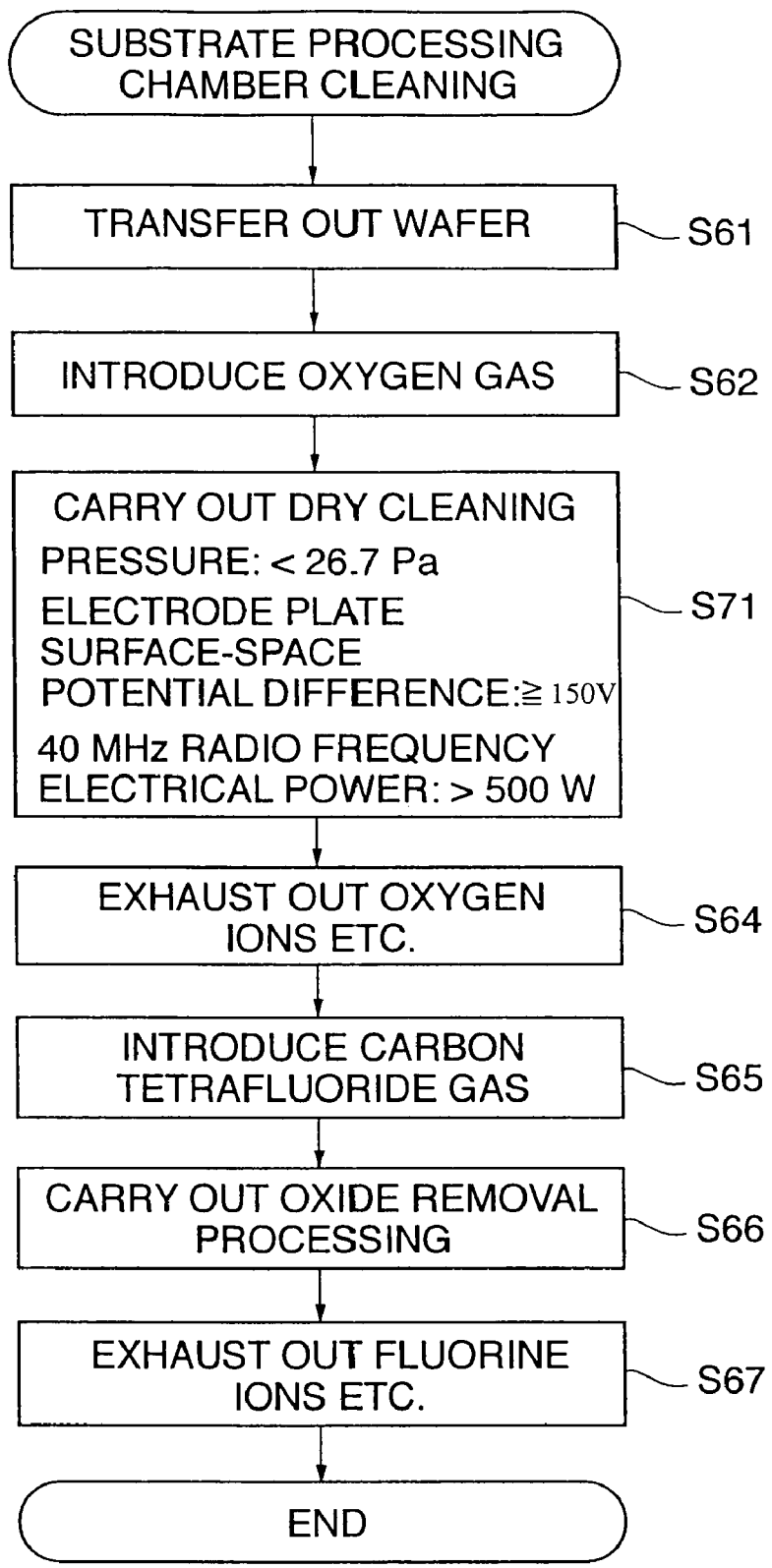
FIG. 7 is a flowchart of a substrate processing chamber cleaning method according to a second embodiment of the present invention.

FIG. 7 is a flowchart of the substrate processing chamber cleaning method according to the present embodiment.

As shown in FIG. 7, first, steps S61 and S62 are carried out as described above, and then 40 MHz radio frequency electrical power and 2 MHz radio frequency electrical power are applied into the processing space S so as to produce plasma, whereby dry cleaning (attached matter removal processing) is carried out (step S71) (first plasma processing step).

In step S71, the pressure in the processing space S is set to less than 26.7 Pa using the APC valve 15. Moreover, the magnitude of the 2 MHz radio frequency electrical power supplied to the susceptor 12 from the other radio frequency power source 46 is adjusted so as to set the electrode plate surface-space potential difference to not less than 150 V. Furthermore, the magnitude of the 40 MHz radio frequency electrical power supplied to the susceptor 12 from the radio frequency power source 20 is set to more than 500 W.

In step S71, oxygen ions and oxygen radicals are produced from the oxygen gas due to the 40 MHz radio frequency electrical power and the 2 MHz radio frequency electrical power in the processing space S. At this time, because the pressure in the processing space S is set to less than 26.7 Pa, the electrode plate surface-space potential difference is set to not less than 150 V, and the magnitude of the 40 MHz radio frequency electrical power is set to more than 500 W, the number of oxygen ions reaching the surface of the upper electrode plate 38 is not reduced; rather, not only low-energy oxygen ions but also high-energy oxygen ions are drawn onto the surface of the upper electrode plate 38. Of the oxygen ions drawn onto the surface of the upper electrode plate 38, the low-energy oxygen ions react with the silicon of the upper electrode plate 38 to form oxide, but the high-energy oxygen ions collide with the surface of the upper electrode plate 38 so that the oxide produced from the low-energy oxygen ions is removed through sputtering. Note, however, that in step S71, the oxide is not necessarily removed completely, but rather a small amount of oxide may remain on the surface of the upper electrode plate 38.

Next, steps S64 to S67 are carried out as described above. In step S66, the small amount of oxide remaining on the surface of the upper electrode plate 38 is decomposed and thus removed by fluorine ions and fluorine radicals. The present processing then comes to an end.

According to the processing of FIG. 7 described above, in the dry cleaning (step S71), because the electrode plate surface-space potential difference is set to not less than 150 V, of the oxygen ions that are drawn onto the surface of the upper electrode plate 38, high-energy oxygen ions collide with the surface of the upper electrode plate 38 so that oxide attached to the surface of the upper electrode plate 38 is removed through sputtering. Formation of an oxide film on the surface of the upper electrode plate 38 can thus be prevented reliably.

In the substrate processing chamber cleaning method according to each of the embodiments described above, the cleaning method is carried out with no wafer W housed in the substrate processing chamber 11; however, the cleaning method may be carried out while a wafer W is housed in the substrate processing chamber 11.

For example, in the plasma processing apparatus 10, a wafer W having an anti-reflection film (a BARC film) and an insulating layer formed on a surface thereof is housed in the substrate processing chamber 11, carbon tetrafluoride gas is introduced into the processing space S, and fluorine ions and fluorine radicals are produced from the carbon tetrafluoride gas, so that the anti-reflection film is removed by the fluorine ions and fluorine radicals, and furthermore the insulating layer exposed through the anti-reflection film being removed is subjected to RIE. At this time, reaction product becomes attached to the surface of the upper electrode plate 38, and hence oxygen gas is introduced into the processing space S, and oxygen ions and oxygen radicals are produced from the oxygen gas, whereby the reaction product is removed by the oxygen ions and oxygen radicals. During the removal of the reaction product, an oxide film due to the oxygen ions is formed on the surface of the upper electrode plate 38. This oxide film is removed by the fluorine ions and fluorine radicals produced when the anti-reflection film removal is carried out after a new wafer W having an anti-reflection film and an insulating layer formed on a surface thereof has been housed in the substrate processing chamber 11. As a result, manufacture of semiconductor devices from wafers W and cleaning of the substrate processing chamber 11 can be carried out simultaneously, and hence productivity can be improved.

In the plasma processing apparatus 10 described above, the upper electrode plate 38 is made purely of silicon only, but the upper electrode plate 38 may instead be made of a material containing silicon.

Moreover, in the substrate processing chamber cleaning method according to each of the embodiments described above, formation of an oxide film on the surface of the upper electrode plate 38 is prevented; however, the component on which formation of an oxide film is prevented through the substrate processing chamber cleaning method according to each of the embodiments described above is not limited thereto, but rather may instead be, for example, the side wall member 45 or the susceptor side surface covering member 60.

Moreover, in the substrate processing chamber cleaning method according to each of the embodiments described above, the film removed is an oxide film; however the film removed is not limited thereto, but rather may instead be a nitride film.

The substrates subjected to the RIE or the like in the plasma processing apparatus 10 described above are not limited to being semiconductor wafers for semiconductor devices, but rather may also be any of various substrates used in LCDs (liquid crystal displays), FPDs (flat panel displays) or the like, photomasks, CD substrates, printed substrates, or the like.

It is to be understood that the object of the present invention can also be attained by supplying to a system or apparatus a storage medium in which is stored a program code of software that realizes the functions of an embodiment as described above, and then causing a computer (or CPU, MPU, etc.) of the system or apparatus to read out and execute the program code stored in the storage medium.

In this case, the program code itself read out from the storage medium realizes the functions of the embodiment, and hence the program code and the storage medium in which the program code is stored constitute the present invention.

The storage medium used for supplying the program code may be, for example, a floppy (registered trademark) disk, a hard disk, a magnetic-optical disk, an optical disk such as a CD-ROM, a CD-R, a CD-RW, a DVD-ROM, a DVD-RAM, a DVD-RW or a DVD+RW, a magnetic tape, a nonvolatile memory card, or a ROM. Alternatively, the program code may be downloaded via a network.

Moreover, it is to be understood that the functions of the embodiment can be accomplished not only by executing a program code read out by the computer, but also by causing an OS (operating system) or the like which operates on the computer to perform a part or all of the actual operations based on instructions of the program code.

Furthermore, it is to be understood that the functions of the embodiment can also be accomplished by writing a program code read out from a storage medium into a memory provided on an expansion board inserted into the computer or in an expansion unit connected to the computer and then causing a CPU or the like provided on the expansion board or in the expansion unit to perform a part or all of the actual operations based on instructions of the program code.

What is claimed is:

1. A method of cleaning a substrate processing chamber that has therein a space into which a substrate is transferred and carries out plasma processing on the substrate in the space, the substrate processing chamber having a processing chamber inside component made of silicon and at least part of which is exposed to the space, the substrate processing chamber cleaning method comprising:
   a substrate transferring out step of transferring out the substrate from the substrate processing chamber;
   a first plasma processing step of introducing oxygen gas into the space, producing oxygen ions and oxygen radicals from the introduced oxygen gas by applying radio frequency electrical power into the space, reacting the oxygen radicals with reaction product attached to the processing chamber inside component so that the reaction product is decomposed and thus removed; and
   a second plasma processing step of introducing carbon tetrafluoride gas into the space, producing fluorine ions and fluorine radicals from the introduced carbon tetrafluoride gas by applying radio frequency electrical power into the space, and decomposing and removing oxide remaining on the surface of the processing chamber inside component by the fluorine ions and the fluorine radicals,
   wherein in said first and second plasma processing steps, the plasma processing is not carried out on the substrate, and
   wherein in said first plasma processing step, a potential difference between the surface of the processing chamber inside component and the space is set to 0V.

2. A computer-readable storage medium including computer executable instruction, wherein the instructions, when executed by a processor, cause the processor to perform a method of cleaning a substrate processing chamber that has therein a space into which a substrate is transferred and carries out plasma processing on the substrate in the space, the substrate processing chamber having a processing chamber inside component made of silicon and at least part of which is exposed to the space, comprising:
   a substrate transferring out module for transferring out the substrate from the substrate processing chamber;
   a first plasma processing module for introducing oxygen gas into the space, producing oxygen ions and oxygen radicals from the introduced oxygen gas by applying radio frequency electrical power into the space, reacting the oxygen radicals with reaction product attached to the processing chamber inside component so that the reaction product is decomposed and thus removed; and
   a second plasma processing module introducing carbon tetrafluoride gas into the space, producing fluorine ions and fluorine radicals from the introduced carbon tetrafluoride gas by applying radio frequency electrical power into the space, and decomposing and removing oxide remaining on the surface of the processing chamber inside component by the fluorine ions and the fluorine radicals,
wherein said first and second plasma processing modules do not carry out the plasma processing on the substrate, and wherein said first plasma processing module sets to 0V a potential difference between the surface of the processing chamber inside component and the space.

* * * * *